(12) United States Patent
Gao (10) Patent No.: US 11,758,682 B2
(45) Date of Patent: Sep. 12, 2023

(54) DISTRIBUTED INFRASTRUCTURE AND MOBILE ARCHITECTURE FOR EDGE COMPUTING

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

(*) Notice: Subject to any disclaimer, the term of this patent is extended or adjusted under 35 U.S.C. 154(b) by 436 days.

(21) Appl. No.: 16/575,385

(22) Filed: Sep. 19, 2019

(65) Prior Publication Data

US 2021/0092862 A1    Mar. 25, 2021

(51) Int. Cl.
  *H05K 7/14*      (2006.01)
  *H05K 7/20*      (2006.01)

(52) U.S. Cl.
  CPC ......... *H05K 7/1497* (2013.01); *H05K 7/2079* (2013.01); *H05K 7/20745* (2013.01)

(58) Field of Classification Search
  CPC .............. H04L 41/0893; H04L 41/5009; H04L 41/065; G06F 9/5061; G06F 15/161; G06F 1/3206; H05K 7/20836; H05K 7/1497; H05K 7/20745; H05K 7/2079
  See application file for complete search history.

(56) References Cited

U.S. PATENT DOCUMENTS

| | | | |
|---|---|---|---|
| 6,407,671 B1* | 6/2002 | Mulvihill | G08B 17/10 340/628 |
| 9,380,728 B1* | 6/2016 | Dunwoody | H05K 7/1487 |
| 10,455,726 B2* | 10/2019 | Cader | H05K 7/20781 |
| 10,638,635 B2* | 4/2020 | Arnouse | H05K 7/20709 |
| 10,649,491 B2* | 5/2020 | Arnouse | G06F 1/1656 |
| 10,747,281 B1* | 8/2020 | Trim | H04N 7/18 |
| 2003/0223193 A1* | 12/2003 | Smith | H05K 7/20736 361/679.48 |
| 2004/0039745 A1* | 2/2004 | Evans | G06F 16/289 |
| 2006/0055135 A1* | 3/2006 | Tracewell | H05K 5/0234 280/47.35 |
| 2009/0234613 A1* | 9/2009 | Brey | G01K 1/026 702/150 |
| 2013/0198384 A1* | 8/2013 | Kirsch, II | H04L 41/0886 709/226 |
| 2014/0218861 A1* | 8/2014 | Shelnutt | H05K 7/20818 361/679.53 |
| 2014/0307384 A1* | 10/2014 | Best | H05K 7/1497 361/679.53 |
| 2016/0266913 A1* | 9/2016 | Achillopoulos | G06F 1/1628 |

(Continued)

*Primary Examiner* — Michael A Matey
(74) *Attorney, Agent, or Firm* — WOMBLE BOND DICKINSON (US) LLP (57) ABSTRACT

Distributed infrastructure and mobile architecture for edge computing are disclosed. For one example, an edge computing container includes a plurality of modules. Each module has plug and play connectivity, and the modules are assembled to provide information technology (IT) space to house IT devices, cooling system, energy source and storage, and power system. The modules can be pre-fabricated and assembled as a single container unit. A source distribution unit (SDU) can assembled on an IT rack and connected to the modules. The single container unit can be loaded in a vehicle or transportation system for transportation in the process of deployment. The modules in the single container unit can also be operational during transportation.

20 Claims, 7 Drawing Sheets

(56) References Cited

U.S. PATENT DOCUMENTS

| | | | | |
|---|---|---|---|---|
| 2017/0339804 A1* | 11/2017 | Ingalz | ......... | H02M 1/4208 |
| 2018/0139870 A1* | 5/2018 | Meadows | ......... | F28D 1/0461 |
| 2018/0213669 A1* | 7/2018 | Kochukunju | ......... | H05K 7/1488 |
| 2019/0362080 A1* | 11/2019 | Achillopoulos | ......... | H04L 41/24 |
| 2020/0025451 A1* | 1/2020 | Stone | ......... | F28D 5/02 |
| 2020/0136906 A1* | 4/2020 | Guim Bernat | ......... | H04L 41/5054 |
| 2021/0007234 A1* | 1/2021 | Achillopoulos | ......... | H02G 3/081 |
| 2021/0037466 A1* | 2/2021 | Silva | ......... | H04W 52/0219 |
| 2021/0067842 A1* | 3/2021 | Revital | ......... | H04N 21/2347 |
| 2021/0068307 A1* | 3/2021 | Bailey | ......... | F24F 11/79 |
| 2021/0075863 A1* | 3/2021 | Achillopoulos | ......... | G07C 9/00182 |
| 2021/0216450 A1* | 7/2021 | Hirko | ......... | G06F 12/0802 |
| 2021/0224054 A1* | 7/2021 | Sarkar | ......... | G06F 8/63 |

* cited by examiner

FIG. 7

DISTRIBUTED INFRASTRUCTURE AND MOBILE ARCHITECTURE FOR EDGE COMPUTING

FIELD

Embodiments of the invention relate generally to edge computing infrastructure, architecture, and hardware. More particularly, embodiments of the invention relate to distributed infrastructure and mobile architecture for edge computing.

BACKGROUND

Today, billions of computing devices are connected to the Internet. As a result, the Internet of Things (IoT) ecosystem is an exponentially growing network of interconnected computing devices. IoT devices can include smart devices, smart vehicles, connected systems etc. using wired or wireless communication over the Internet. Data from the IoT devices can be processed and analyzed in a cloud environment, which can include a data center housing thousands of servers and information technology (IT) equipment for central or core computing. It is not feasible, however, to send all data from IoT devices to the cloud for analysis and processing to service IoT devices.

In such an IoT environment, edge computing allows data from IoT devices to be analyzed and processed at the edge or close to the edge before sending data from IoT devices to a data center or cloud environment. This allows edge computing to provide high performance computation, storage and network resources closer to users of IoT devices in order to improve response times and computation performance instead of relying, solely on cloud resources, addition, reduce significant costs for data transferring. As such, edge computing plays an important role for offloading and distributing processing and computing from the cloud having a data center with thousands of information technology (IT) devices and equipment to handle massive amounts of data storage and analysis for IoT devices.

For example, time sensitive applications include artificial intelligence (AI) applications such as autonomous driving (AD). A vehicle with AD driving capabilities requires edge computing because AI data analysis needs to be implemented in real time without delays which may occur if all AI analysis is performed in the cloud. As a result, edge computing for this type of application should be as close as possible to the end user such as in the vehicle providing AD capabilities. As such, the location for edge computing deployment and infrastructure is also critical to handle time sensitive applications for IoT devices. As edge computing becomes more popular, infrastructure still needs development in this sector for the growing market demand.

BRIEF DESCRIPTION OF THE DRAWINGS

The appended drawings illustrate examples and embodiments and are, therefore, exemplary and not considered to be limiting in scope.

DETAILED DESCRIPTION

As set forth in the detailed description, various embodiments, examples and aspects will be described with reference to details discussed below, and the accompanying drawings will illustrate various embodiments and examples. The following description and drawings are illustrative and are not to be considered as limiting. Numerous specific details are described to provide a thorough understanding of various embodiments and examples. However, in certain instances, well-known or conventional details are not described to facilitate a concise discussion of the embodiments and examples.

Reference in the detailed description to "one embodiment" or "one example" means that a particular feature, structure, or characteristic described in conjunction with the embodiment or example can be included in at least one embodiment or example of the disclosure. The appearances of the phrase "in one embodiment" or "in one example" in various places in the detailed description do not necessarily refer to the same embodiment or example. Although the following embodiments or examples refer to edge computing architecture and containers, the embodiments and examples can be implemented for any type of computing and computing containers that require mobility in deployment and infrastructure.

Embodiments and examples are disclosed for mobile edge computing, infrastructure and architecture. According to one embodiment, an edge computing container or system is disclosed having modules that are easily connected and assembled to form a single container unit for deploying edge computing. Each module can have plug and play connectivity and can be assembled to provide information technology (IT) space to house IT devices or equipment (e.g., servers, blade servers, telematics blade array, etc.), cooling system, energy source and storage, power system, and other supporting systems. This single container unit of assembled modules can be loaded in a vehicle or transportation system (e.g., an autonomous driving vehicle) for transportation and deployment at any location. For example, the container can be deployed closer to users of Internet of Things (IoT) smart devices or other devices. The container also includes a source distribution unit (SDU) having blind mating connectors to connect the IT devices to the cooling system, energy storage system and power system or other devices and networking connections. The SDU can have an integrated processor to control and manage the entire container for mobile edge computing.

According to one embodiment, a method for edge computing is disclosed for assembling edge computing modules to form a container. A SDU can be connected to the assembled edge computing modules. The SDU is powered on to turn on the assembled edge computing modules. The container can be deployed near users of IoT devices, which is closer than a cloud environment that can service the IoT devices. For one embodiment, information technology (IT) devices or equipment are inserted into an IT space module within the container. Other modules are connected to the IT space module including a cooling system module, energy source module, energy storage module and power system module. For one embodiment, turning on the SDU turns on the cooling system module, energy source module, energy storage module and power system module such that the IT devices and equipment are operational.

For one embodiment, the container with assembled modules can be operational while being transported for deployment near users of IoT devices thereby making edge computing mobile. In this way, mobile edge computing can be dynamic in the process of relocating or deploying the edge computing container to any location where it is needed or required, preferably close to IoT devices than a data center for cloud computing. As a result, the following embodiments and examples of mobile edge computing provide a flexible deployment and architecture for edge computing including exchanging data, processing transactions, distributing computing and storage power between users of IoT devices a core data center for cloud computing.

Figure 1:
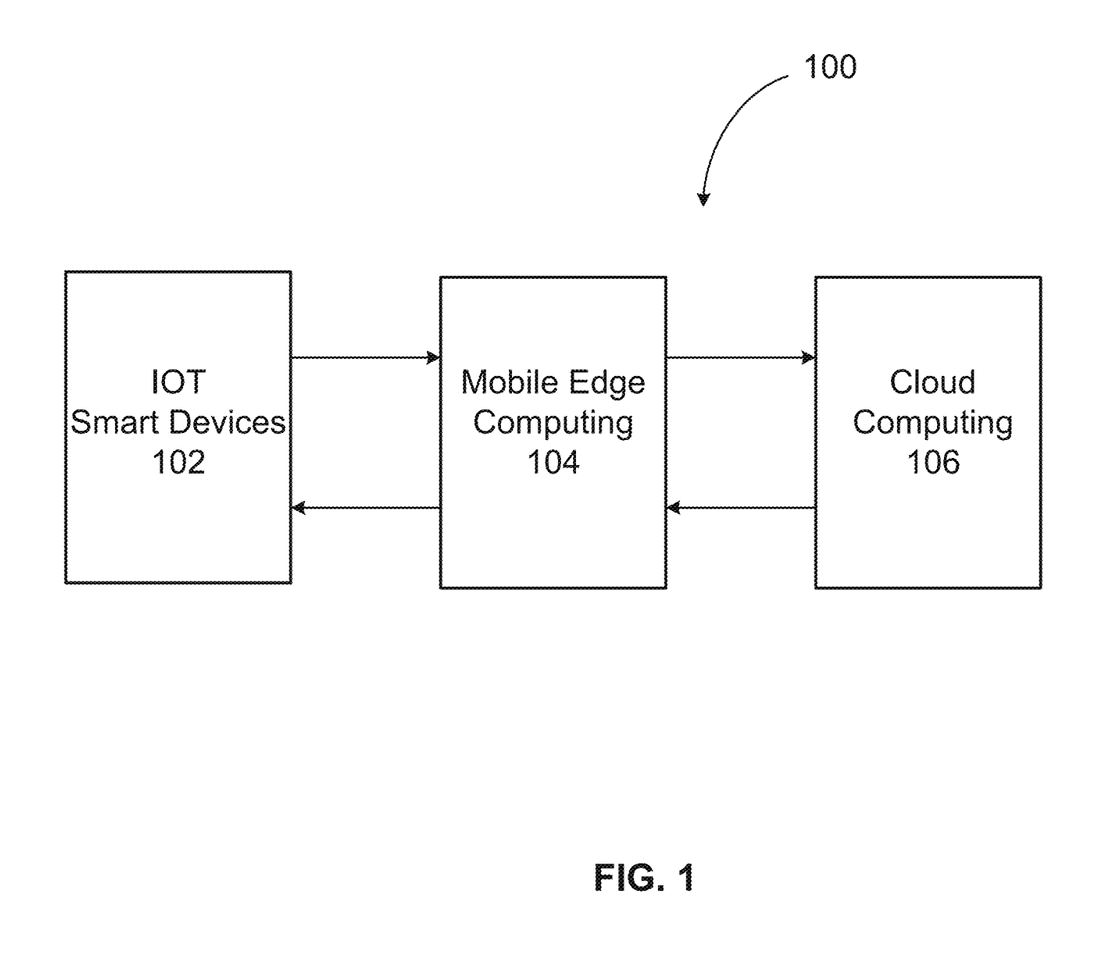
FIG. 1 illustrates a mobile edge computing environment according to one embodiment.

FIG. 1 illustrates a mobile edge computing environment 100 according to one embodiment. Environment 100 includes IoT smart devices 102 coupled to mobile edge computing 102 in between cloud computing 106. For one embodiment, cloud computing 106 can include a data center housing thousands of servers providing major computing and storage services for IoT smart devices 102. Cloud computing 106 can be centralized and in remote locations, e.g., away from major cities. Examples of IoT smart devices 102 can include smart phones, smart home devices, autonomous cars or vehicles, smart factory devices or sensors, smart city devices including traffic lights, smart hospital devices, bank/financial institution devices, school devices etc., which can be distributed in environment 100. For one embodiment, IoT smart devices 102 can generate data to be processed or stored by mobile edge computing 104 or cloud computing 106. In some examples, multiple mobile edge computing 104 may be assembled in the loop between IOT smart devices 102 and cloud computing 106.

For one embodiment, mobile edge computing 104 can implement the infrastructure and mobile enclosure design as described in FIGS. 2-7. Edge computing 104 can include any number of computing systems, e.g., blade servers, between IoT smart devices 102 and cloud computing 106. For this example, for environment 100, edge computing 104 is closer in location to IoT smart devices 102 in comparison to cloud computing 106. As a result, data exchange and transfer can be faster with lower cost by having edge computing 104 closer to IoT smart devices 102. For one embodiment, edge computing 104 processes requests or analyzes data for IoT smart devices 102 and, in other embodiments, some requests or data analysis for IoT smart devices 102 can be performed by cloud computing 106.

Figure 2:
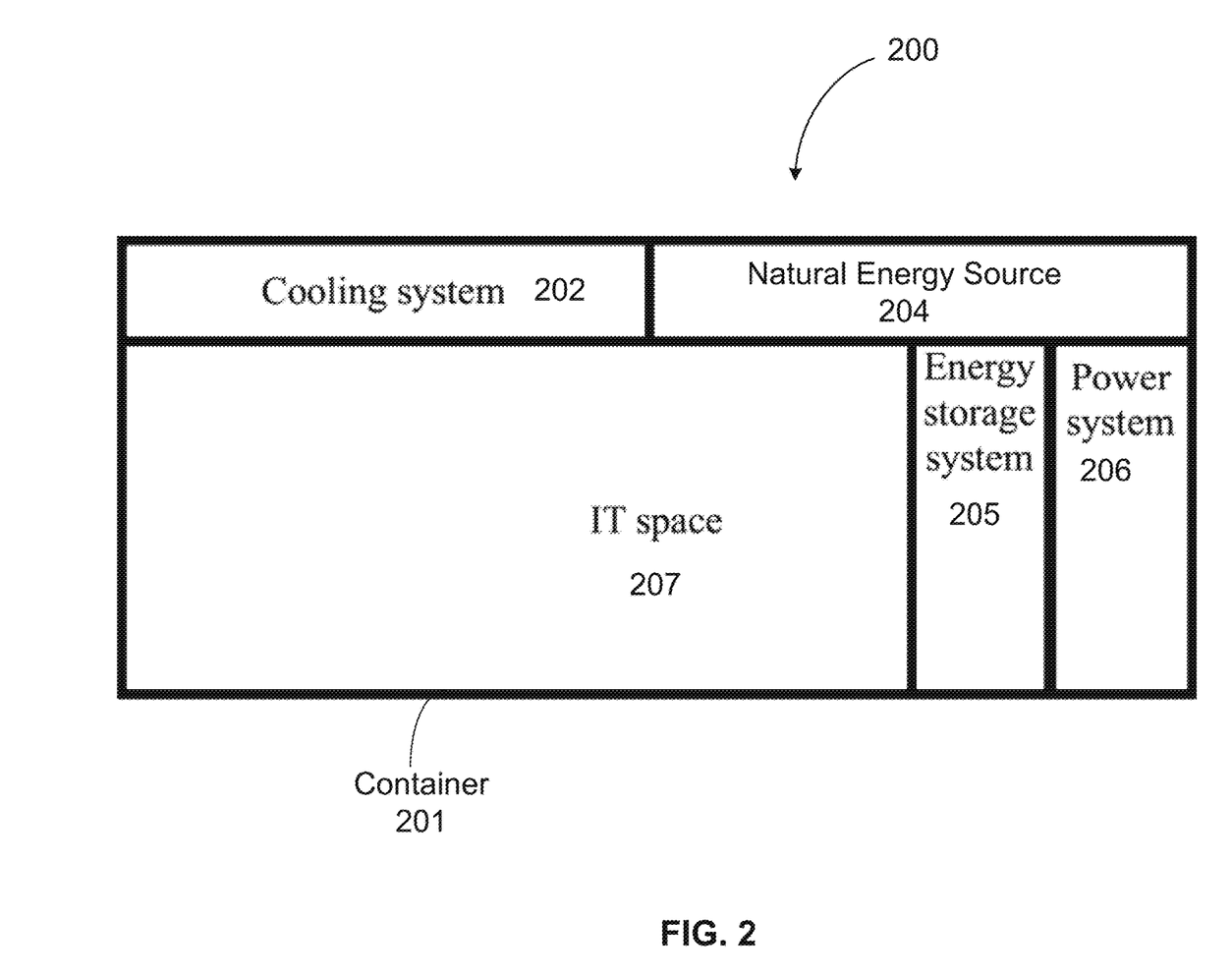
FIG. 2 illustrates an edge computing infrastructure according to one embodiment.

FIG. 2 illustrates an edge computing infrastructure 200 according to one embodiment. Infrastructure 200 can represent mini-data-centers housing IT devices or equipment, e.g., servers, blade servers, or telematics blade array including one or more wireless modems. Such a mini-data-center is mobile and can easily move from one location to another location. For one example, infrastructure 200 can have a compact design housing a fraction and much smaller number of IT devices than a cloud computing data center. For one embodiment, infrastructure 200 describes a container 201 having in which infrastructure 200 can be packaged as a unit and as part of container 201. For example, the container 201 can be mobile with a size sufficient to be loaded in a vehicle or transportation system for transport and delivery.

Edge computing container or system 201, also referred to as an edge computing container system, can have a modular design including a number of modules for information technology (IT) space 207, cooling system 202, energy generation using natural sources 204, energy storage system 205, and power system 207. For one embodiment, the modules, 202, 204, 205, 206 and 207 are prefabricated with plug-and-play type connections and only proper assembling to be fully operable. For other embodiment, these modules can have different dimensions and design specifications to meet plug-and-play functionality. Because infrastructure 200 is mobile, the container 20 can be relocated any location where is needed or required. For one embodiment, while in transport, IT devices such as servers within IT space 207 can be operational to process or analyze data from Internet of Things (IoT) devices via wired or wireless connections. For one embodiment, during transport, the IT devices or servers can be operation in IT space 207 within container 201 to process data or analyze data for IoT smart devices. The servers can be contained in one or more electronic racks. For example, container 201 can be loaded on a truck, car, train, boat, subway and transported or deployed to any location needing edge computing and be operational during transport.

For one embodiment, cooling system 202 can include any type of cooling system architecture or infrastructure to cool devices within container 201. Cooling system 202 can have integrated cooling loops and cooling units operating together as a single module to enable and provide cooling air and/or cooling liquid (e.g., water) to at least IT space 207 or other areas needing cooling such as modules 204, 205 and 206 for power delivery. For one embodiment, IT space 207 houses IT equipment such as, e.g., computer servers, blade servers, storage servers, network gear and equipment and other systems including fire suppression and detection systems.

For one embodiment, energy storage system 205 can be a backup rechargeable battery system including a lithium-ion battery module. The energy storage system 205 can provide power or auxiliary power to IT devices or equipment housed in IT space 207. For example, if a main power to IT devices or equipment is down or disabled, energy storage system 205 can provide backup power to the IT devices or equipment. As such, energy storage system 205 plays a critical and vital role to ensure that IT devices or equipment can maintain operation during a power failure such that the mobile edge computing infrastructure 200 can continue data processing without data loss or ensure workload data is properly transferred and stored.

For one embodiment, power system 206 can include multiple types of power systems or infrastructures based on, e.g., alternating current (AC) input or low voltage or high voltage direct current (DC) input. For one embodiment, natural energy source 204 can include a natural or reusable power generation system such as a photovoltaic or solar power generation system that can provide power to energy storage system 205. For example, natural energy source 204 can recharge energy storage system 205 having a lithium-ion battery cells.

Referring to FIG. 2, for one embodiment, each of the modules for cooling system 202, IT space 207, natural energy source 204, energy storage system 205, and power system 206 can have connections for easy assembly such as plug and play which can make module installation efficient as well as simplifying replacing of modules. Although not shown, other connections can be implemented for container 201 such as networking connections, e.g., fiber optic connections. Other modifications or adjustments can be added depending on deployment, operation, and location requirements.

Figure 3:
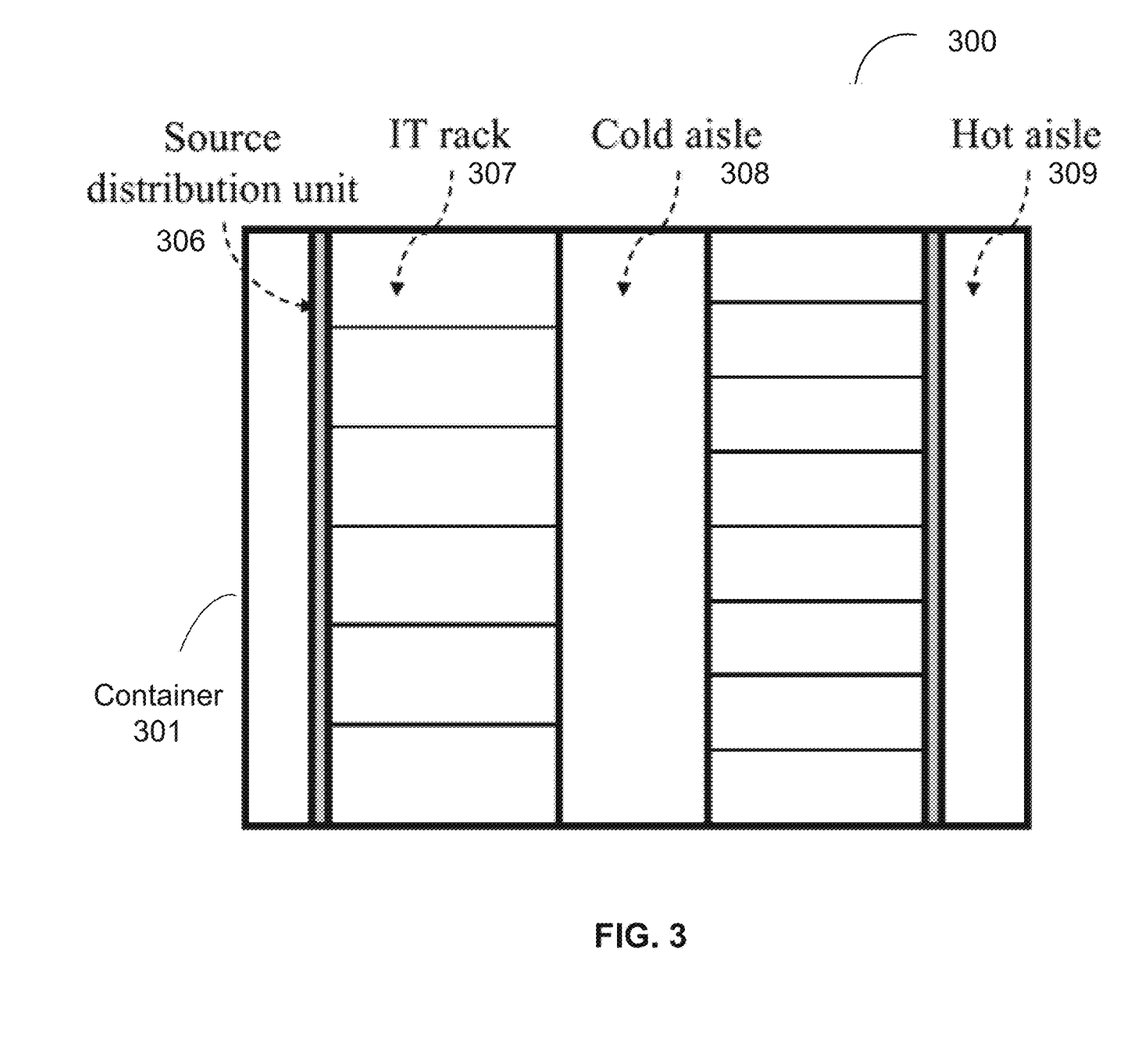
FIG. 3 illustrates a mobile edge computing IT enclosure design according to one embodiment.

FIG. 3 illustrates a mobile edge computing IT enclosure design 300 according to one embodiment. For this example, the IT enclosure design 300 is for IT space having a source distribution unit (SDU) 306 coupled to an IT rack 307 which can house IT devices or equipment, e.g., blade servers, and connected to the SDU 306 within container 301. Within enclosure design, is a cold aisle 306 and hot aisle 309 containment area, which can be coupled to a cooling system, e.g., cooling system 202. Referring to FIG. 3, IT enclosure design 300 provides a simplified infrastructure that enables fast deployment for a container 301 for mobile edge computing. The IT enclosure deign 300 can be pre-fabricated and IT rack 307 or IT space can be adjusted for different rack unit (U) sizes such as 1 U, 2 U, 4 U and so on.

For one embodiment, IT enclosure design 300 follows a cold aisle 308 and hot aisle 309 design and container 301 can have the same size and height as IT rack 307 or IT space. For one embodiment, IT devices or equipment, e.g., blade servers, can be installed into IT rack 307 from the cold aisle 308. For this example, SDU 306 is located at the back of container 301 or behind IT rack 307 for connecting IT devices or equipment, e.g., blade servers, to necessary sources such as cooling system 202, natural energy source 204, energy storage system 205, and power system 206 as shown in FIG. 2. For other embodiments, other systems such as an air ducting system may be included in FIG. 3. However, an air ducting system may not be needed depending on the cooling system deployed for connecting the cooling units with the cold aisle 308 or hot aisle 309.

Figure 4:
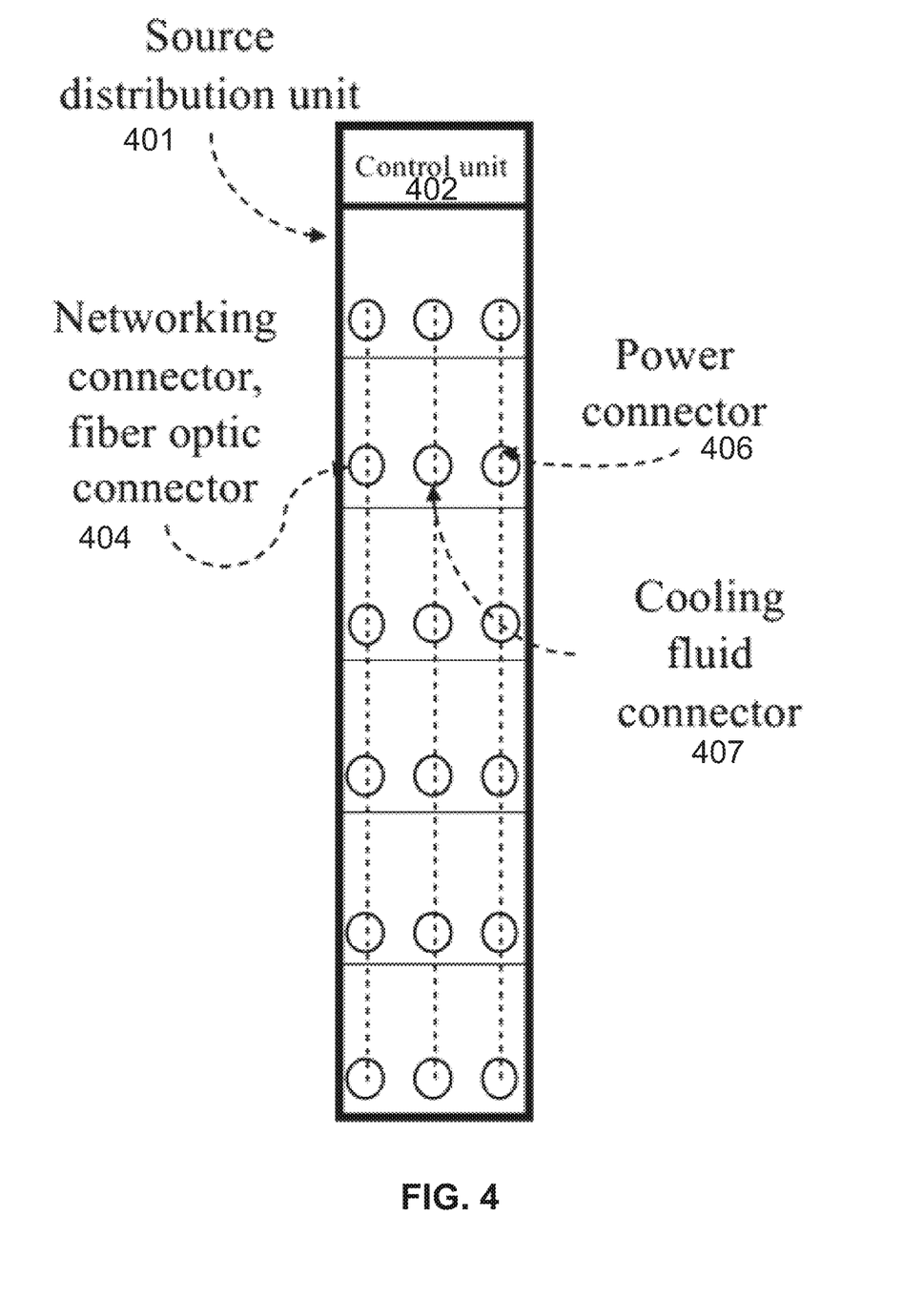
FIG. 4 illustrates a source distribution unit design according to one embodiment.

FIG. 4 illustrates a source distribution unit (SDU) 401 according to one embodiment. SDU 401 includes networking connector, fiber optic connectors 404, power connectors 406, cooling fluid connectors 407. The number of connectors can be dependent on the number of IT devices or equipment in the IT space. SDU also includes a control unit 402 which can include any number of processors, microcontrollers, or other circuitry and components to control the connectors and power and fluid flow.

For one embodiment, SDU 401 is a distribution unit for distributing electrical power, cooling liquid or fluid, as well as providing networking connections for IT devices and equipment in IT space 207. For one embodiment, connectors 404, 406 and 407 can be assembled with SDU 401 as a single unit. For one embodiment, connectors 404, 406 and 407 can include blind-mating connectors, either female or male type of connectors. These connectors 404, 406 and 407 can be mated or connected to connectors of the IT devices or equipment in IT space 207 such that they are connected to the cooling functions, power and networking functions once the IT devices or equipment are installed and connected to SDU 401.

Figure 5:
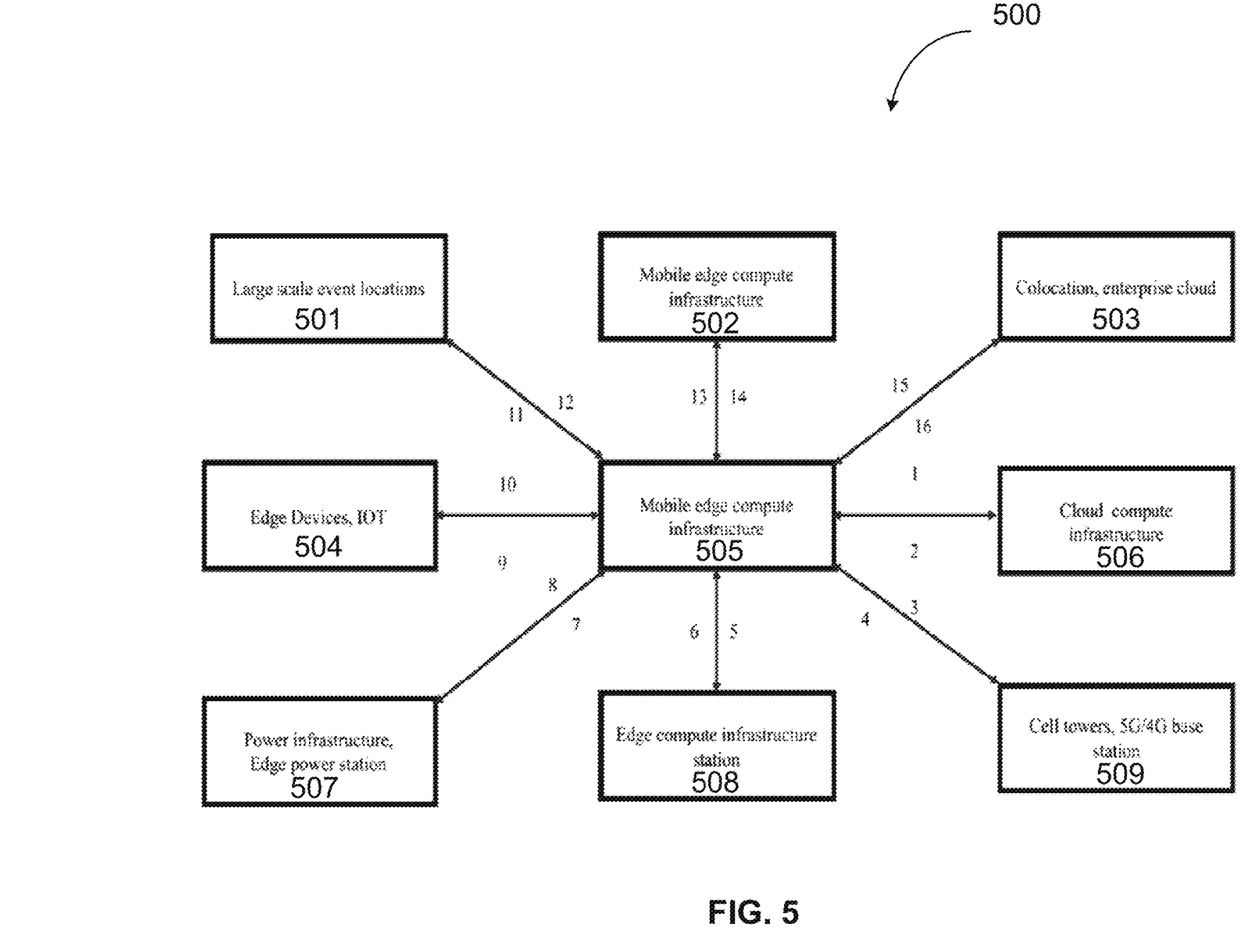
FIG. 5 illustrates an edge computing infrastructure system and operating scenarios according to one embodiment.

FIG. 5 illustrates an edge computing infrastructure system 500 and operating scenarios 1-16 according to one embodiment. Infrastructure 500 includes system units 501 through 509. Referring to FIG. 5, at scenarios 1 and 2, mobile edge compute infrastructure 505 (e.g., as described in FIGS. 1-4 and 6-7) is mobile and can move closer to users of IoT devices in contrast to cloud compute infrastructure 506. In this example, cloud compute infrastructure 506 includes core data centers that are fixed, while mobile edge compute infrastructure 505 can be dynamic and transportable to any location based on need of edge computing. For example, an area in a city may require edge computing such that mobile edge compute infrastructure 505 can be transported to the location and deployed for users of IoT devices in that location. Alternatively, cloud computer infrastructure 506 may need assistance processing and storing data for IoT users and mobile edge computer infrastructure 505 can move closer to cloud compute infrastructure 506. In addition, the computing process within the mobile edge, as well as the data transferring between 505 and 504, 505 and 506 can occur at the same time while the mobile edge compute infrastructure 505 is physically transported.

At scenarios 3 and 4, for one embodiment, mobile edge compute infrastructure 505 may require networking connections provided by cell towers, 5G/4G base station 509. For one example, mobile edge compute infrastructure 505 can move closer to base station 509 by transport in a vehicle or transportation system.

At scenarios 5 and 6, for one embodiment, an edge compute infrastructure station 508 can include edge computing such that modules are assembled, equipped and serviced for mobile edge compute infrastructure 505. For one example, station 508 can be a central location for distributing the edge computing systems. For one embodiment, edge computing modules as shown in FIG. 2 can be stored in station 508 as well as multiple types of IT devices or equipment. For one embodiment, station 508 can provide edge computing and storage functions. For other embodiments, mobile edge compute infrastructure 505 can be redeployed from station 508 to provide edge computing functions in other locations. In one embodiment, the cooling system 202, energy source 204, energy storage system 205, and power system 206 as shown in FIG. 2 can be stored and serviced at edge compute infrastructure station 508.

At scenarios 7-8, for one embodiment, mobile edge compute infrastructure 505 can be deployed near power infrastructure, edge power station 507, which can be a major power source running the distributed infrastructure mobile edge compute infrastructure 505. That is, mobile edge compute infrastructure 505 should be deployed at a location where edge power station 507 is available. As such, the location selection for station 507 is critical in relation to mobile edge compute infrastructure 505. For other embodiments, station 507 can be combined with station 508.

At scenarios 9 and 10, for one embodiment, the location of mobile edge compute infrastructure 505 can be adjusted to be closer to edge devices, IoT 504 or high population density areas. For example, in one embodiment, mobile edge compute infrastructure 505 can move closer to a factor, hospital, financial institution and so on.

At scenarios 11 and 12, for one embodiment, mobile edge compute infrastructure 505 can be deployed near large scale event locations 501. For example, a large scale may not happen frequently, e.g., a sporting event, festivals, fairs, and etc., yet may need edge computing capabilities or services. In this instance, mobile edge compute infrastructure 505 can be transported and deployed near the large scale even locations. In this scenario, the mobile edge compute infrastructure 505 can be temporarily deployed.

At scenarios 13 and 14, for one embodiment, mobile edge compute infrastructure 505 can assist or providing additional edge computing capabilities for an existing mobile edge compute infrastructure 502. That is, in some cases, two more edge compute modules or infrastructures may need to work jointly to service users of IoT devices. In other cases, some the mobile edge compute infrastructures or modules may be equipped with only cooling modules or energy modules to support another mobile edge compute infrastructure. For example, if additional cooling is needed or additional energy storage is needed (e.g., during an emergency situation), mobile edge compute infrastructure 505 can be deployed with a cooling or energy module to assist another mobile edge compute infrastructure or where needed.

At scenarios 15 and 16, for one embodiment, mobile edge compute infrastructure 505 may be deployed close to a colocation, enterprise cloud 503. Such a location may include an enterprise cloud infrastructure, private cloud or colocation data centers. As such, the mobile edge compute infrastructure 505 can be located close to these facilities and locations. For other embodiments, mobile edge compute infrastructure 505 can enable exchange and transfer of physical compute power such as the IT equipment for those colocations or enterprise cloud infrastructures. For example, if an enterprise is supporting a large scale event, the mobile edge compute infrastructure 505 can transfer the business they provide for the event closer to the event location, either the service, the software or the physical hardware as described herein.

Figure 6:
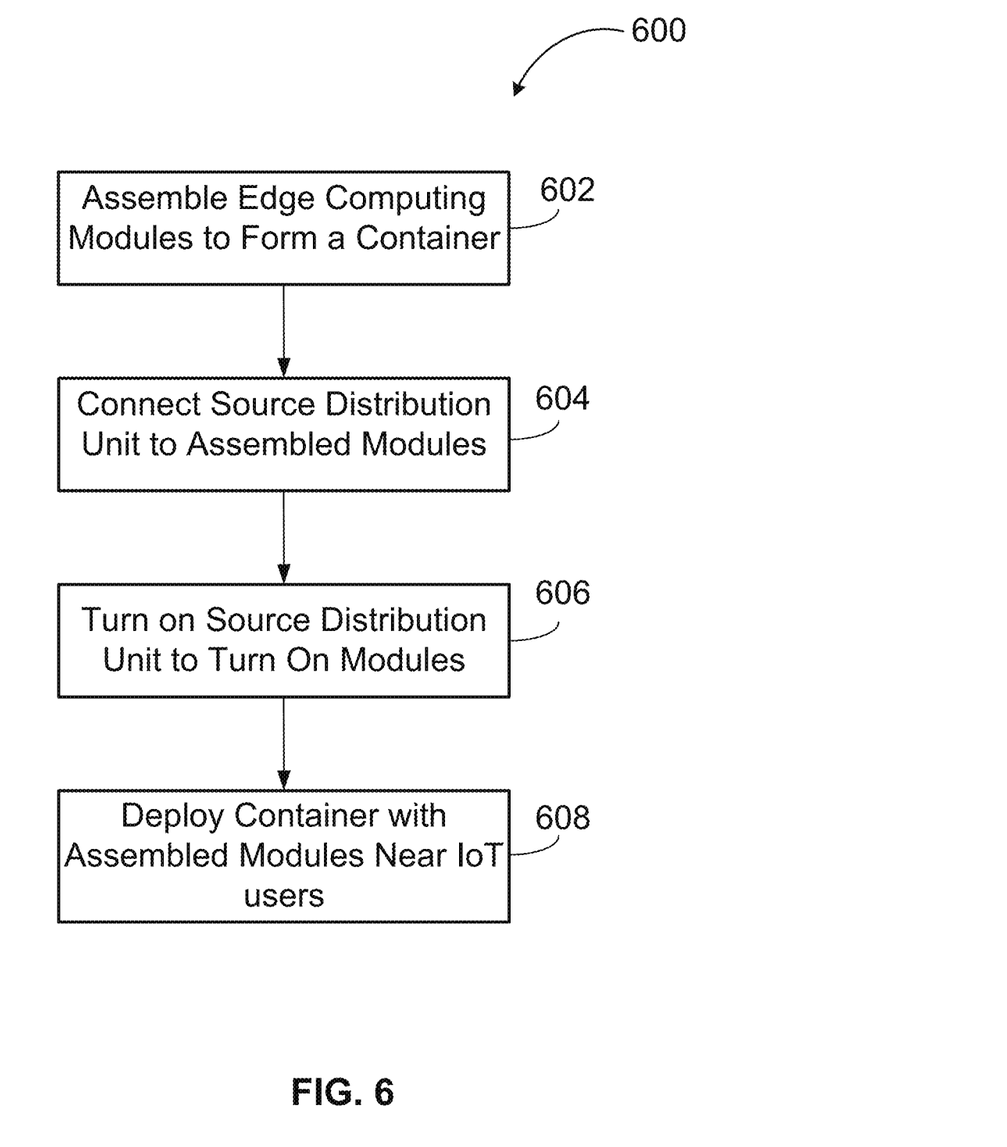
FIG. 6 illustrates a flow diagram of a method for deploying edge computing according to one embodiment.

FIG. 6 illustrates a flow diagram of a process 600 for deploying edge computing according to one embodiment. Process 600 includes processing blocks 602 through 608.

At block 602, edge computing modules are assembled to form a container. The container can be a single container unit. The modules can include a cooling system module, IT space module, energy source module, energy storage module, and power system module. The IT space module can include IT devices and equipment, e.g., blade servers.

At block 604, a source distribution unit (SDU) is connected to the assembled modules. The SDU connects the IT devices and equipment in the IT space module with the other modules in the single container unit.

At block 606, the SDU is turned on to turn on the modules. This allows power to be distributed to the IT devices and equipment and providing cooling system functionality.

At block 608, the container is deployed with assembled modules near IoT users. For one example, the container is deployed closer to the IoT users than a data center providing cloud computing for the IoT users. The single container unit can be operational while being transported in a vehicle or transport system for deployment.

Figure 7:
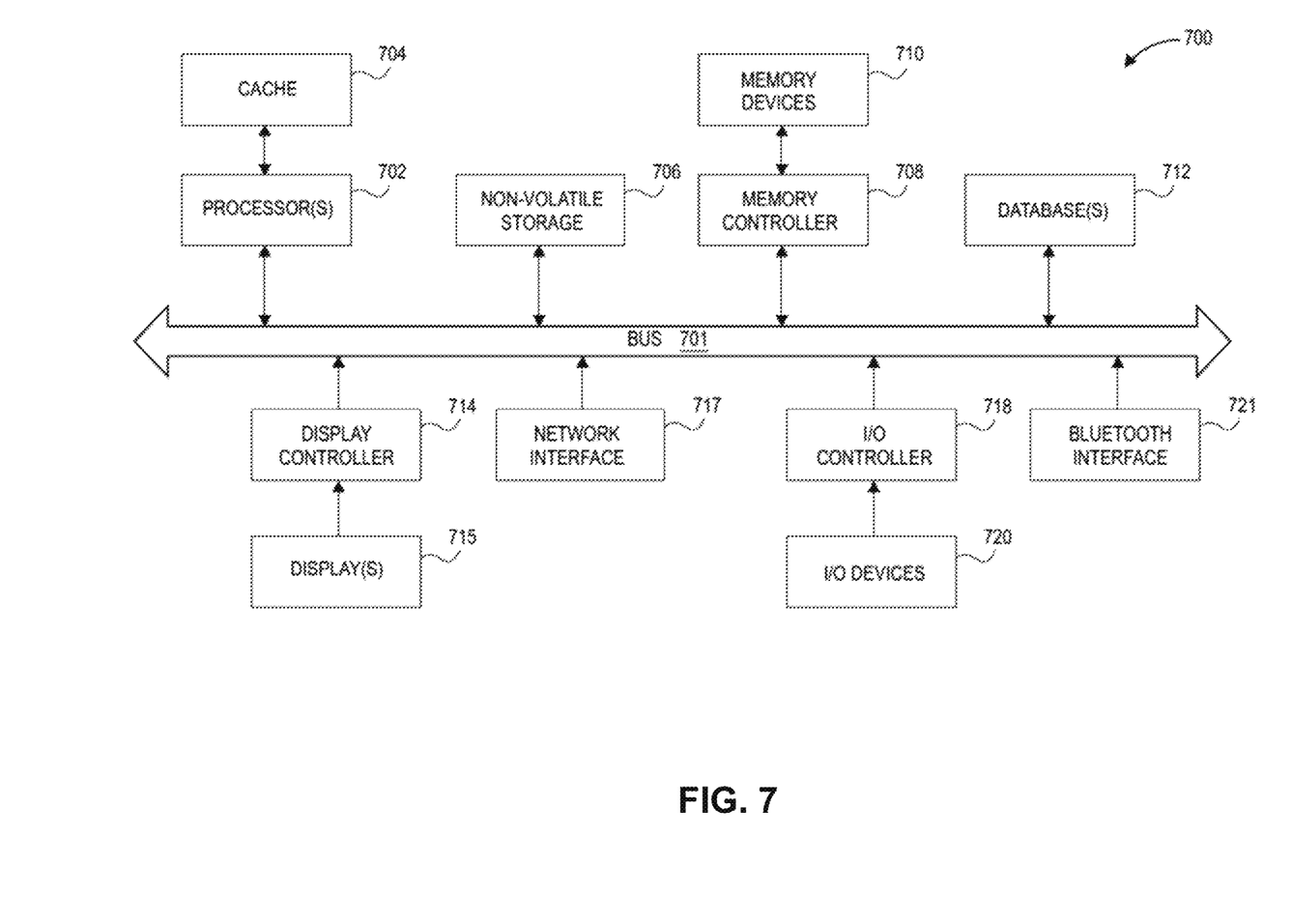
FIG. 7 illustrates a computing architecture for a server according to one embodiment.

FIG. 7 illustrates a computing architecture 700 for a server according to one embodiment. The computing architecture 700 can represent a server for edge computing or cloud computing as shown in FIGS. 2-6. Although FIG. 7 illustrates various components of a server or computing system, the components are not intended to represent any particular architecture or manner of interconnecting the components, as such details are not germane to the disclosed examples or embodiments. Network computers and other data processing systems or other consumer electronic devices, which have fewer components or perhaps more components, may also be used with the disclosed examples and embodiments.

Referring to FIG. 7, computing architecture 700, which is a form of a computing system, includes a bus 701, which is coupled to processor(s) 702 coupled to cache 704, display controller 714 coupled to a display 715, network interface 717, non-volatile storage 706, memory controller coupled to memory 710, I/O controller 718 coupled to I/O devices 720, and database 712. Processor(s) 702 can include one or more central processing units (CPUs), graphical processing units (GPUs), a specialized processor or any combination thereof. Processor(s) 702 can retrieve instructions from any of the memories including non-volatile storage 706, memory 710, or database 712, and execute the instructions to perform operations described in FIGS. 1-6. Database 712 can also represent a routing database 104 and processor(s) 802 can store data for IoT smart devices which can communicate with computing architecture 700.

Examples of I/O devices 720 include mice, keyboards, printers and other like devices controlled by I/O controller 718. Network interface 817 can include modems, wired and wireless transceivers and communicate using any type of networking protocol including wired or wireless WAN and LAN protocols including LTE and Bluetooth interface and an API interface to communicate with Bluetooth devices. Computing architecture 700 can also include a Bluetooth interface 721 that provide Bluetooth communication with Bluetooth devices. Memory 710 can be any type of memory including random access memory (RAM), dynamic random-access memory (DRAM), which requires power continually in order to refresh or maintain the data in the memory. Non-volatile storage 706 can be a mass storage device including a magnetic hard drive or a magnetic optical drive or an optical drive or a digital video disc (DVD) RAM or a flash memory or other types of memory systems, which maintain data (e.g. large amounts of data) even after power is removed from the system.

For one example, memory devices 710 or database 712 can store data from users of IoT smart devices or other devices. Although memory devices 710 and database 712 are shown coupled to system bus 701, processor(s) 702 can be coupled to any number of external memory devices or databases locally or remotely by way of network interface 717 or Bluetooth interface 721, e.g., database 712 can be secured storage in a cloud environment.

Data processed or analyzed by the disclosed mobile edge computing embodiments and examples can be implemented by a data processing system or computing system, or a computer-readable medium or computer program product. Data processed and analyzed by the disclosed mobile edge computing or cloud computing embodiments or examples can take hardware or software or a combination of both, which can be referred to as a system or engine, to implement data processing or analysis. Furthermore, data processed or analyzed can be implemented in the form of a computer program product including one or more computer readable mediums having computer readable code which can be executed by one or more processors (e.g., processor(s) 702) to implement data processing and analysis and, in particular, data processing or analysis from IoT smart devices or other devices.

In the foregoing specification, embodiments and examples of the disclosure have been described with reference to specific exemplary embodiments thereof. It will be evident that various modifications may be made thereto without departing from the broader spirit and scope of the disclosure as set forth in the following claims.

For example, any number of modifications can be implemented such as using any type of cooling system, power source and storage, and power control system. The IT enclosure design can varying cold aisle and hot aisle configurations and IT rack. The mobile edge computing enclosure can have multiple layers while still providing a mobile edge computing architecture. Other equipment or devices may be included with the mobile edge computing enclosure including multiple source distribution units. Therefore, the specification and drawings are, accordingly, to be regarded in an illustrative sense rather than a restrictive sense.

What is claimed is:

1. An edge computing system, comprising:
    an information technology (IT) space having a plurality of electronic racks including a first electronic rack and a second electronic rack disposed therein, the first electronic rack having a frontend and a backend and the second electronic rack having a frontend and a backend, and the frontends of the first and second electronic racks forming a cold aisle, wherein each of the electronic racks contains one or more servers to provide data processing services to a plurality of Internet of Thing (IoT) devices;
a cooling system coupled to the electronic racks to provide cooling to the servers of the electronic racks;
a power system to provide power to the electronic racks and the cooling system, the power system including an alternating current input and a direct current input;
an energy storage system to provide backup power when the power system is unavailable;
a container containing the IT space, the cooling system, the power system, and the energy storage system therein, the container comprising a first exterior wall opposite a second exterior wall, the first exterior wall and the backend of the first electronic rack forming a first hot aisle, and the second exterior wall and the backend of the second electronic rack forming a second hot aisle, wherein the edge computing system is a mobile system deployable between the IoT devices and a cloud data center; and
a source distribution unit (SDU) having connectors to connect the servers to the cooling system, energy storage system, and power system, wherein the SDU is powered on to turn on the cooling system, the energy storage system, and the power system using one or more of the alternating current input and the direct current input.

2. The edge computing system of claim 1, wherein each of the cooling system, the power system, and the energy storage system is pre-fabricated and assembled as a single container unit within the container.

3. The edge computing system of claim 2, wherein a single container unit of assembled modules can be loaded in a vehicle or transportation system for deployment.

4. The edge computing system of claim 1, wherein the servers process data or stores data from one or more IoT devices before the data is processed or stored in the cloud data center.

5. The edge computing system of claim 1, wherein the cooling system provides air or liquid cooling functions for the servers.

6. The edge computing system of claim 1, wherein the SDU includes a control unit having a processor to control operations of the cooling system, the power system, and the energy storage system.

7. The edge computing system of claim 1, wherein for each of the electronic racks, the SDU includes a first connector connecting the electronic rack to the power system to receive power, a second connector connecting the electronic rack to the cooling system, and a third connector connecting the electronic rack to the energy storage system.

8. The edge computing system of claim 7, wherein the first, second, and third connectors are blind mate connectors.

9. The edge computing system of claim 7, wherein the second connector is configured to receive cooling liquid from the cooling system to provide liquid cooling to the servers of the electronic rack.

10. The edge computing system of claim 1, further comprising a natural energy system configured to generate power using a natural energy source to provide power to the electronic racks and the cooling system.

11. The edge computing system of claim 1, wherein the SDU extends along the backend of the first electronic rack and along the backend of the second electronic rack.

12. The edge computing system of claim 1, wherein the edge computing system is configured to service the one or more IoT devices during transport.

13. The edge computing system of claim 1, wherein the edge computing system comprises a fire suppression and detection system within the container.

14. An edge computing system, comprising:
an information technology (IT) space having a plurality of electronic racks including a first electronic rack and a second electronic rack disposed therein, the first electronic rack having a frontend and a backend and the second electronic rack having a frontend and a backend, and the frontends of the first and second electronic racks forming a cold aisle, wherein each of the electronic racks contains one or more servers to provide, via one or more wireless connections, data processing services to a plurality of Internet of Thing (IoT) devices;
a cooling system coupled to the electronic racks to provide cooling to the servers of the electronic racks;
a power system to provide power to the electronic racks and the cooling system, wherein the power system includes an alternating current input and a direct current input;
an energy storage system to provide backup power when the power system is unavailable; and
a container containing the IT space, the cooling system, the power system, and the energy storage system therein, the container comprising a first exterior wall opposite a second exterior wall, the first exterior wall and the backend of the first electronic rack forming a first hot aisle, and the second exterior wall and the backend of the second electronic rack forming a second hot aisle,
a source distribution unit (SDU) having connectors to connect the servers to the cooling system, energy storage system, and power system, wherein the SDU is powered on to turn on the cooling system, the energy storage system, and the power system using one or more of the alternating current input and the direct current input,
wherein the edge computing system is a mobile system deployable between the IoT devices and a cloud data center, and the IT space, cooling system, power system, and energy system are grouped together as a unit, and wherein the edge computing system is configured to service the one or more IoT devices during transport via the one or more wireless connections.

15. The edge computing system of claim 14, wherein the SDU includes a control unit having a processor to control operations of the cooling system, the power system, and the energy storage system.

16. The edge computing system of claim 14, wherein the edge computing system comprises a fire suppression and detection system within the container.

17. An edge computing system, comprising:
a cooling system coupled to electronic racks to provide cooling to servers of the electronic racks, the electronic racks comprising a first electronic rack and a second electronic rack, the first electronic rack having a frontend and a backend and the second electronic rack having a frontend and a backend, and the frontends of the first and second electronic racks forming a cold aisle;

a power system to provide power to the electronic racks and the cooling system, wherein the power system includes an alternating current input and a direct current input;

an energy storage system to provide backup power when the power system is unavailable;

a container containing the cooling system, the power system, and the energy storage system, and the servers for servicing one or more Internet of Thing (IoT) devices the container comprising a first exterior wall opposite a second exterior wall, the first exterior wall and the backend of the first electronic rack forming a first hot aisle, and the second exterior wall and the backend of the second electronic rack forming a second hot aisle; and a source distribution unit (SDU) having connectors to connect the servers to the cooling system, energy storage system, and power system, wherein the SDU is powered on to turn on the cooling system, the energy storage system, and the power system using one or more of the alternating current input and the direct current input, wherein the edge computing system is a mobile system deployable between the IoT devices and a cloud data center, and wherein the edge computing system is configured to service the one or more IoT devices during transport.

18. The edge computing system of claim 17, wherein the SDU includes a control unit having a processor to control operations of the cooling system, the power system, and the energy storage system.

19. The edge computing system of claim 17, wherein the SDU extends along the backend of the first electronic rack and along the backend of the second electronic rack.

20. The edge computing system of claim 17, wherein the edge computing system is configured to service the one or more IoT devices during transport via one or more wireless connections.

* * * * *